United States Patent
Yamazaki

(10) Patent No.: US 9,012,769 B2
(45) Date of Patent: Apr. 21, 2015

(54) PHOTOELECTRIC CONVERSION DEVICE

(75) Inventor: Shunpei Yamazaki, Toyko (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 244 days.

(21) Appl. No.: 13/468,367

(22) Filed: May 10, 2012

(65) Prior Publication Data

US 2012/0298191 A1 Nov. 29, 2012

(30) Foreign Application Priority Data

May 25, 2011 (JP) ................................. 2011-116489

(51) Int. Cl.
- *H01L 31/0236* (2006.01)
- *H01L 31/0264* (2006.01)
- *H01L 31/0224* (2006.01)
- *H01L 31/0352* (2006.01)
- *H01L 31/0747* (2012.01)

(52) U.S. Cl.
CPC ...... *H01L 31/035281* (2013.01); *H01L 31/022433* (2013.01); *H01L 31/0747* (2013.01); *Y02E 10/547* (2013.01)

(58) Field of Classification Search
CPC ............ H01L 31/0236; H01L 31/0264; H01L 31/022433; H01L 31/035281; H01L 31/074; Y02E 10/547
USPC .......................... 136/244, 252, 256, 258, 261
See application file for complete search history.

(56) References Cited

U.S. PATENT DOCUMENTS

| | | | |
|---|---|---|---|
| 5,213,628 A | | 5/1993 | Noguchi et al. |
| 6,506,622 B1* | | 1/2003 | Shiozaki .................. 438/73 |
| 2007/0204902 A1* | | 9/2007 | Dutta .......................... 136/256 |
| 2011/0041910 A1 | | 2/2011 | Shimomura et al. |

FOREIGN PATENT DOCUMENTS

| | | |
|---|---|---|
| JP | 04-130671 | 5/1992 |
| JP | 10-135497 | 5/1998 |

* cited by examiner

*Primary Examiner* — Susan D Leong
(74) *Attorney, Agent, or Firm* — Nixon Peabody LLP; Jeffrey L. Costellia

(57) ABSTRACT

Provided is a photoelectric conversion device characterized by a lattice-shaped current-collection metal electrode and a depressed portion provided in opening regions of a lattice structured by the lattice-shaped current collection electrode. This structure results in the reduction in the area of a heterojunction containing a highly-doped semiconductor layer, which decreases the influence of carrier recombination promoted by the high concentration of an impurity and leads to the improved electric characteristic of the photoelectric conversion device. The lattice shape of the current collection electrode also makes it possible to exclude the use of a light-transmitting current collection electrode and allows a protective insulating layer having a high light-transmitting property to be formed over the current collection electrode, which contributes to the reduction of the light absorption loss.

20 Claims, 7 Drawing Sheets

PHOTOELECTRIC CONVERSION DEVICE

BACKGROUND OF THE INVENTION

1. Field of the Invention

The present invention relates to a photoelectric conversion devices.

2. Description of the Related Art

Recently, a photoelectric conversion device that generates power without carbon dioxide emissions has attracted attention as a countermeasure against global warming. As a typical example thereof, a solar cell has been known which uses a crystalline silicon substrate such as a single crystalline substrate or a polycrystalline silicon substrate.

In solar cells using a crystalline silicon substrate, a structure having a so-called homo junction is widely used. In such a structure, a layer having the conductivity type opposite to that of the crystalline silicon substrate is formed on one surface side of the crystalline silicon substrate by diffusion of impurities.

Further, solar cells are disclosed in Patent Documents 1 and 2 in each of which a heterojunction is formed by formation of an amorphous silicon layer having an optical bandgap and a conductivity type which are different from those of a crystalline silicon substrate on one surface or both surfaces of the crystalline silicon substrate so that interface properties are improved.

REFERENCE

Patent Document

[Patent Document 1] Japanese Published Patent Application No. H04-130671
[Patent Document 2] Japanese Published Patent Application No. R10-135497

SUMMARY OF THE INVENTION

In a solar cell having the heterojunction, a p-n junction is formed in which an i-type amorphous semiconductor layer is provided between a single crystal silicon substrate having one conductivity type and an amorphous semiconductor layer having a conductivity type opposite to that of the single crystal silicon substrate.

The provision of the i-type amorphous semiconductor layer in a p-n junction region has effects of terminating surface defects of the single crystal silicon substrate and forming a steep junction, which contributes to reduction in carrier recombination at a hetero interface.

On the other hand, in an amorphous semiconductor layer for forming the junction, there are many localized levels due to many impurities and carrier recombination easily occurs. Further, conduction properties in a horizontal direction are not sufficient because of small electrical conductivity owing to its amorphous structure; thus, a light-transmitting conductive film that promotes movement of carriers is needed over the amorphous semiconductor layer.

The light-transmitting conductive film can also have an effect of serving as a surface passivation film and an antireflection film; however, the effect is inferior to an insulating film such as an oxide film or a nitride film. Further, light transmittance of the light-transmitting conductive film in a light-absorption wavelength range of a single crystal semiconductor is around 90%, which has been a factor in light absorption loss.

In view of the above problems, an object of one embodiment of the present invention is to provide a heterojunction type photoelectric conversion device having a structure capable of reducing, carrier recombination in a junction region. Further, another object is to provide a heterojunction type photoelectric conversion device in which electric characteristics are improved by employing a structure without a light-transmitting conductive film.

One embodiment of the present invention disclosed in this specification relates to a photoelectric conversion device in which a junction layer having a high carrier concentration is formed on the top of a projected portion formed on a surface of a single crystal silicon substrate and a current collection electrode is formed over the junction layer.

One embodiment of the present invention disclosed in this specification is a photoelectric conversion device including a single crystal silicon substrate having one conductivity type and having unevenness including lattice-shaped projected portions each with a flat top and a depressed portion between the projected portions on one surface of the single crystal silicon substrate; an i-type first silicon semiconductor layer formed on the top of the projected portion; a second silicon semiconductor layer formed on the first silicon semiconductor layer and having a conductivity type opposite to that of the single crystal silicon substrate; a first electrode formed on the second silicon semiconductor layer; an i-type third silicon semiconductor layer formed on the one surface of the single crystal silicon substrate so as to cover a surface of a stacked structure of the single crystal silicon substrate, the first silicon semiconductor layer, the second silicon semiconductor layer, and the first electrode; a fourth silicon semiconductor layer formed on the third silicon semiconductor layer and having a conductivity type opposite to that of the single crystal silicon substrate; a protective film formed on the fourth silicon semiconductor layer; an i-type fifth silicon semiconductor layer formed on the other surface of the single crystal silicon substrate; a sixth silicon semiconductor layer formed on the fifth silicon semiconductor layer and having the same conductivity as the single crystal silicon substrate; and a second electrode formed on the sixth silicon semiconductor layer.

It is to be noted that the ordinal numbers such as "first" and "second" in this specification, etc. are assigned in order to avoid confusion among components, but not intended to limit the number or order of the components.

The width of the first electrode may be smaller than that of the second silicon semiconductor layer.

The protective film is preferably a light-transmitting insulating film.

One embodiment of the present invention disclosed in this specification is a photoelectric conversion device including a single crystal silicon substrate having, one conductivity type and having unevenness including lattice-shaped projected portions each with a flat top and a depressed portion between the projected portions on both surfaces of the single crystal silicon substrate; an i-type first silicon semiconductor layer formed on the top of the projected portion on one surface of the single crystal silicon substrate; a second silicon semiconductor layer formed on the first silicon semiconductor layer and having a conductivity type opposite to that of the single crystal silicon substrate; a first electrode formed on the second silicon semiconductor layer; an i-type third silicon semiconductor layer formed on the one surface of the single crystal silicon substrate so as to cover a surface of a stacked structure of the single crystal silicon substrate, the first silicon semiconductor layer, the second silicon semiconductor layer, and the first electrode; a fourth silicon semiconductor layer formed on the third silicon semiconductor layer and having a conductivity type opposite to that of the single crystal silicon substrate; a first protective film formed on the fourth silicon semiconductor layer; an i-type fifth silicon semiconductor layer formed on the top of the projected portion on the other surface of the single crystal silicon substrate; a sixth silicon semiconductor layer formed on the fifth silicon semiconductor layer and having the same conductivity as the single crystal silicon substrate; a second electrode formed on the sixth silicon semiconductor layer; a seventh silicon semiconductor layer formed on the other surface of the single crystal silicon substrate so as to cover the other surface of a stacked structure of the single crystal silicon substrate, the fifth silicon semiconductor layer, the sixth silicon semiconductor layer, and the second electrode; an eighth silicon semiconductor layer formed on the seventh silicon semiconductor layer and having the same conductivity as the single crystal silicon substrate; and a second protective film formed on the eighth silicon semiconductor layer.

The depressed portion preferably has an inverted square pyramid shape. In addition, in the depressed portion, unevenness including a plurality of projections the height of which is lower than that of the projected portion and a depression formed between the projections may be formed. In other words, the surface of the depressed portion may have a sawtoothed shape whose projection is smaller than the projected portion of the lattice-shaped projection.

It is preferable that a region of the third silicon semiconductor layer, which is provided between and in contact with the second silicon semiconductor layer and the fourth silicon semiconductor layer; have the same conductivity type as the second silicon semiconductor layer and the fourth silicon semiconductor layer and the other region of the third silicon semiconductor layer have i-type conductivity.

In this specification, the objects with the same conductivity type can have different carrier concentrations in its range. Thus, a layer and a region which have the same conductivity type but intentionally varied carrier concentrations are described in each case.

The second silicon semiconductor layer preferably has a higher carrier concentration than the fourth silicon semiconductor layer.

The sixth silicon semiconductor layer preferably has a higher carrier concentration than the single crystal silicon substrate.

Further, in the structure of the photoelectric conversion device in which unevenness is formed on both the surfaces of the single crystal silicon substrate, the widths of the first electrode and the second electrode may be smaller than those of the second silicon semiconductor layer and the sixth silicon semiconductor layer, respectively.

Further, in the structure of the photoelectric conversion device in which unevenness is formed on both the surfaces of the single crystal silicon substrate, a region of the seventh silicon semiconductor layer, which is provided between and in contact with the sixth silicon semiconductor layer and the eighth silicon semiconductor layer preferably has the same conductivity type as the sixth silicon semiconductor layer and the eighth silicon semiconductor layer, and the other region of the seventh silicon semiconductor layer preferably has i-type conductivity.

Further, in the structure of the photoelectric conversion device in which unevenness is formed on both the surfaces of the single crystal silicon substrate, the sixth silicon semiconductor layer has a higher carrier concentration than the eighth silicon semiconductor layer.

The first protective film and the second protective Film are preferably light-transmitting insulating films.

According to one embodiment of the present invention, influence, of the carrier recombination in a junction region can be reduced. Further, a heterojunction type photoelectric conversion device can be provided in Which electric characteristics are improved by employing a structure without a light-transmitting conductive film.

DETAILED DESCRIPTION OF THE INVENTION

Figure 1A:
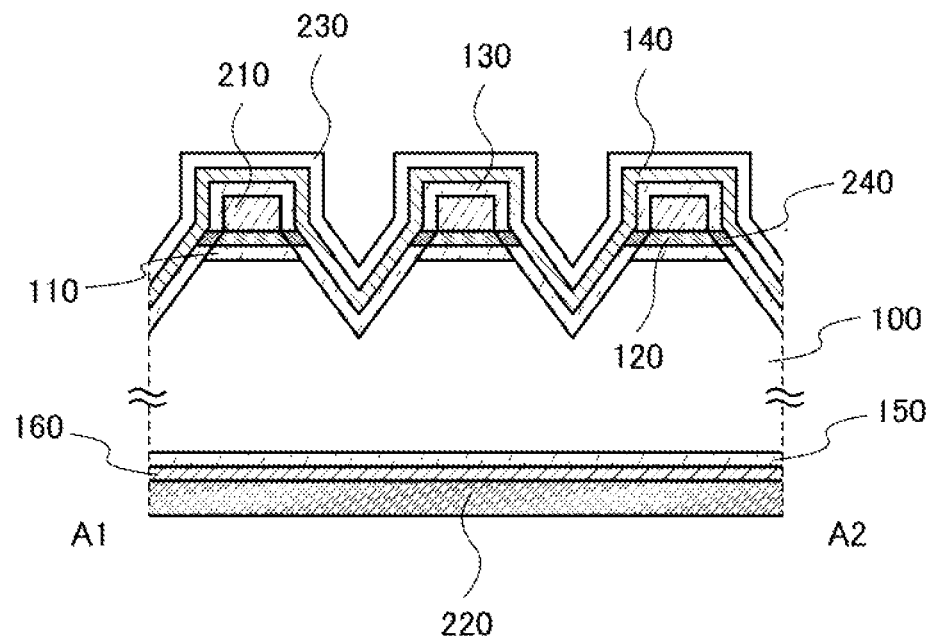
FIGS. 1A and 1B are cross-sectional views each illustrating a photoelectric conversion device.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. In the drawings for explaining the embodiments, the same portions or portions having similar functions are denoted by the same reference numerals, and description of such portions is not repeated in some cases.

In this embodiment, a photoelectric conversion device according to one embodiment of the present invention, and a manufacturing method thereof will be described.

Figure 1B:
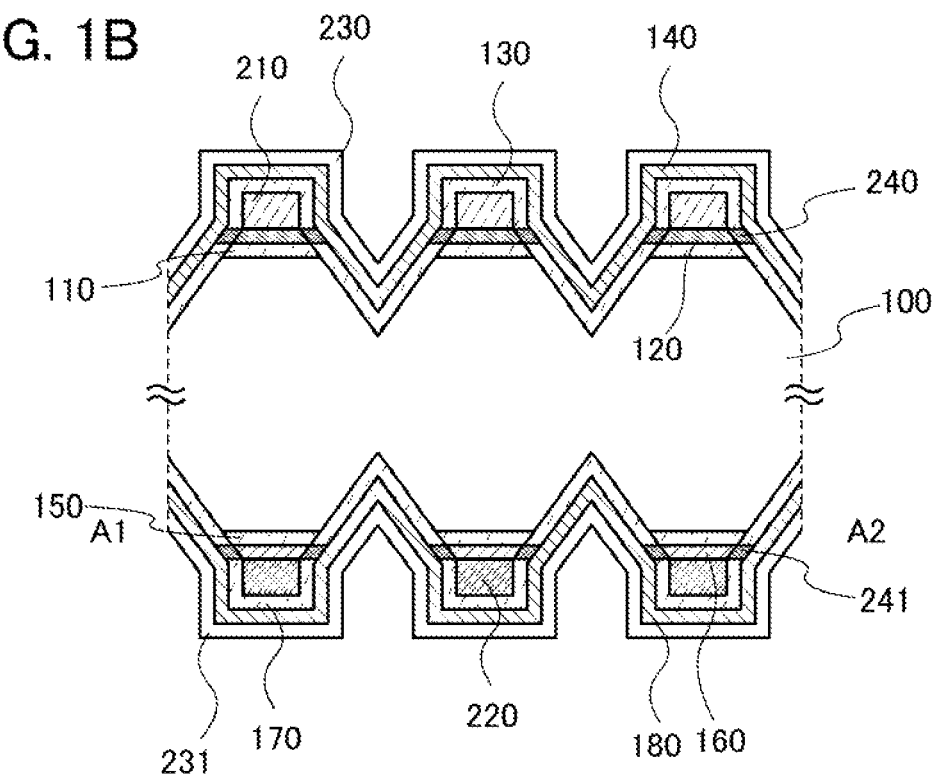

FIGS. 1A and 1B are cross-sectional views each illustrating a photoelectric conversion device according to one embodiment of the present invention. The cross sectional views each correspond to a cross section taken along line A1-A2 in FIG. 4 that is a plan view illustrating a part of the photoelectric conversion device according to one embodiment of the present invention. Note that a, third silicon semiconductor layer 130, a fourth silicon semiconductor layer 140, and a protective layer 230 are not shown in FIG. 4 for clarity.

The photoelectric conversion device according to one embodiment of the present invention, illustrated in FIG. 1A, includes a single crystal silicon substrate 100 having one conductivity type and having unevenness including lattice-shaped projected portions each with a flat top and a depressed portion between the projected portions on one surface of the single crystal silicon substrate 100. On the one surface of the single crystal silicon substrate 100, a first silicon semiconductor layer 110, a second silicon semiconductor layer 120, and a first electrode 210 are stacked in this order on the top of the projected portion, and the third silicon semiconductor layer 130, the fourth silicon semiconductor layer 140, and the protective layer 230 are stacked in this order so as to cover the one surface of the single crystal silicon substrate 100 and the surface of the stacked structure. Further, on the other surface of the single crystal silicon substrate 100, a fifth silicon semiconductor layer 150, a sixth silicon semiconductor layer 160, and a second electrode 220 are stacked in this order. Note that a surface side where the unevenness is formed serves as a light-receiving surface in a structure of the photoelectric conversion device.

The photoelectric conversion device according to one embodiment of the present invention, illustrated in FIG. 1B, includes the single crystal silicon substrate 100 having one conductivity type and having unevenness including lattice-shaped projected portions each with a flat top and a depressed portion between the projected portions on both surfaces thereof. On one surface of the single crystal silicon substrate 100, the first silicon semiconductor layer 110, the second silicon semiconductor layer 120, and the first electrode 210 are stacked in this order on the top of the projected portion, and the third silicon semiconductor layer 130, the fourth silicon semiconductor layer 140, and the protective layer 230 are stacked in this order so as to cover the one surface of the single crystal silicon substrate 100 and the surface of the stacked structure. Further, on the other surface of the single crystal silicon substrate 100, the fifth silicon semiconductor layer 150, the sixth silicon semiconductor layer 160, and the second electrode 220 are stacked in this order on the top of the projected portion, and a seventh silicon semiconductor layer 170, an eighth silicon semiconductor layer 180, and a protective layer 231 are stacked in this order so as to cover the other surface of the single crystal silicon substrate 100 and the surface of the stacked structure. Note that both the surfaces serve as light-receiving surfaces in the structure of the photoelectric conversion device.

The structures in FIGS. 1A and 1B are different from each other in terms of whether the unevenness and the stacked structure of the semiconductor layers formed on the top of the projected portion are formed on one surface of the single crystal silicon substrate 100, or both surfaces thereof. Note that the height of the projected portion included in the unevenness and a distance between the projected portions are each preferably greater than or equal to 1 μm and less than or equal to 100 μm. Note that the height of the projected portion means the distance between a top surface of a portion of the single crystal silicon substrate 100 where the thickness of the single crystal silicon substrate 100 is the smallest and the top of the projected portion.

In the structure shown in FIG. 1A, light which enters through the light-receiving surface travels obliquely into the single crystal silicon substrate 100 due to the unevenness on the surface; thus, the optical path length is increased and photoexcited carriers are increased. In addition, a so-called light trapping effect in which light reflected by the back surface is totally reflected by the surface can be produced. Since the surface area of the rear surface side where unevenness is not formed is small, the number of surface defects is relatively small and carrier recombination can be relatively low. However, the light-receiving surface is limited to the side surface on which unevenness is formed.

On the other hand, in the structure shown in FIG. 1B, light that travels into the single crystal silicon substrate 100 is easily reflected in the substrate repeatedly due to the unevenness formed on both the surfaces; thus, the optical path length is further increased compared to the structure in FIG. 1A. Further, both the surfaces can be light-receiving surfaces; accordingly, not only the direct light from a light source, but also indirect light such as reflected light from other objects can contribute to photoelectric conversion. However, the single crystal silicon substrate having unevenness on both the surface has large surface area and thus the number of surface defects is relatively large and carrier recombination easily occurs compared to the structure shown in FIG. 1A.

The relative merits of the structures shown in FIGS. 1A and 1B depend on the installation site or the like, thus, the structure to be used can be selected by the practitioner in accordance with the purpose.

The semiconductor layers and the insulating films formed over the first electrode 210 and the second electrode 220 each of which is formed on the top of the projected portion are partially removed to form an exposed region (not illustrated). An extraction electrode in contact with the exposed regions may be provided. By such a structure, electrical connection between the photoelectric conversion device and a load or another photoelectric conversion device becomes easy.

In the above structure, the first silicon semiconductor layer 110, the third silicon semiconductor layer 130, the fifth silicon semiconductor layer 150, and the seventh silicon semiconductor layer 170 which are in contact with the single crystal silicon substrate 100 are each formed using an i-type silicon semiconductor and can terminate surfaces defects of the single crystal silicon substrate 100. Thus, carrier recombination can be reduced: specifically, an open circuit voltage (Voc) and a fill factor (F.F.) can be improved. Note that in this specification, an "i-type semiconductor" refers not only to a so-called intrinsic semiconductor in which the Fermi level lies in the vicinity of the center of the band gap, but also to a semiconductor in which the concentration of an impurity imparting p-type or n-type conductivity is $1 \times 10^{20}$ cm$^{-3}$ or less, and in which the photoconductivity is higher than the dark conductivity.

For example, the first silicon semiconductor layer 110, the third silicon semiconductor layer 130, the fifth silicon semiconductor layer 150, and the seventh silicon semiconductor layer 170 can each be formed using amorphous silicon or microcrystalline silicon. Further, these silicon semiconductor layers may include both a crystalline silicon region and an amorphous silicon region.

The crystalline silicon region has a crystal growth region in a region being in contact with the single crystal silicon substrate 100, where the atomic arrangement is epitaxial to the atomic arrangement in the single crystal silicon substrate. Thus, a clear interface is not formed between the single crystal silicon substrate and the crystalline silicon region, and both or them substantially construct one phase. That is, the crystalline silicon region has high crystallinity comparable to that in the single crystal silicon substrate, in which the numbers of impurities and defects are extremely small.

The concentrations of impurities of atmospheric components and the like in a region between the single crystal silicon substrate 100 and the crystalline silicon region obtained by SIMS analysis are preferably as follows: oxygen concentration is $5 \times 10^{20}$ cm$^{-3}$ or less, carbon concentration is $3 \times 10^{19}$ cm$^{-3}$ or less, and nitrogen concentration is $2 \times 10^{18}$ cm$^{-3}$ or less. The impurities having higher concentrations than those described above in the region cause defective crystal growth and deterioration of electric characteristics of the photoelectric conversion device.

Further, the amorphous silicon region is formed on the crystalline silicon region which is in contact with the single crystal silicon substrate 100. The amorphous silicon region is continuously formed on the crystalline silicon region. For example, the crystalline silicon region and the amorphous silicon region are formed in such a manner that the crystalline silicon region is formed by a plasma CVD method or the like and then the amorphous silicon region is formed on the crystalline silicon region without steps including cleaning, transportation, and the like in between; alternatively, the formation process of the amorphous silicon region is started Were the formation process of the crystalline silicon region is completed.

By the method described above in which the crystalline silicon region and the amorphous silicon region are continuously formed without steps in between, a region having a high impurity concentration, an oxide layer, and the like are not formed therebetween, which inhibits the formation of clear interface. Thus, it can be said that both the crystalline silicon region and the amorphous silicon region are substantially continuous or the phase change between the amorphous silicon region and the crystalline silicon region continuously occurs.

Note that in the region including the crystalline silicon region and the amorphous silicon region, the surface of the crystalline silicon is covered with the amorphous silicon including hydrogen so that the dangling bonds on the surface of the crystalline silicon, which cause the defects, are terminated.

As described above, a clear interface is not formed between, the single crystal silicon substrate 100 and the crystalline silicon region nor between the crystalline silicon region and the amorphous silicon region; thus, influence of localized levels formed by defects at an interface and impurities can be removed. Further, the crystalline silicon region has few defects and the absolute amount of defects in the entire region including the crystalline silicon region and the amorphous silicon region can be reduced; thus, carrier recombination can be reduced.

The surface of the crystalline silicon region has an uneven shape in which the height of a projection included in the unevenness and a distance between the projections are each in a nanometer to several hundreds nanometer size. By this shape, an effect similar to an optical effect of the aforementioned unevenness is obtained. Therefore, the photoelectric conversion devices Shawn in FIGS. 1A and 1B can each have a structure in which unevenness with a nanometer size is formed on the surface of the unevenness with a micrometer size, whereby electric characteristics of the photoelectric conversion devices can be improved by the optical effect.

The second silicon semiconductor layer 120 is a semiconductor layer having a conductivity type opposite to that of the single crystal silicon substrate 100. Thus, a p-n junction is formed between the single crystal silicon substrate 100 and the second silicon semiconductor layer 120 with the first silicon semiconductor layer 110 provided therebetween. Note that the second silicon semiconductor layer 120 can be formed as an amorphous silicon layer or a microcrystalline silicon layer containing an impurity imparting a conductivity type.

Figure 4:
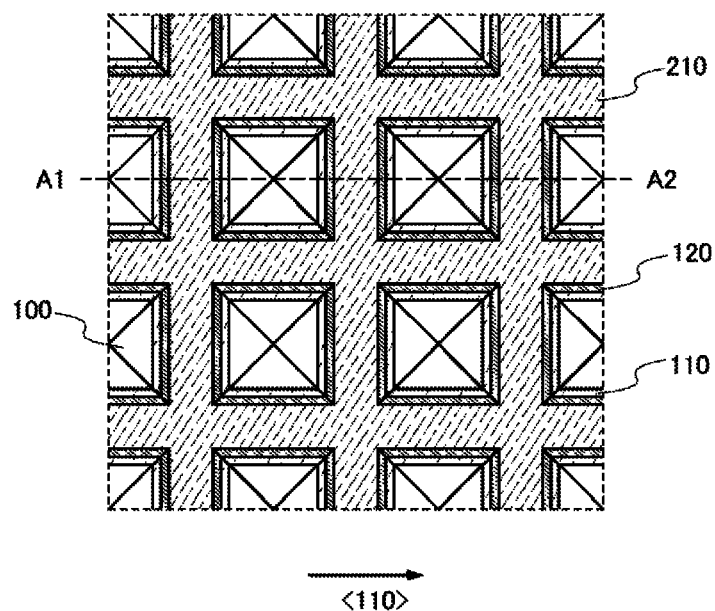
FIG. 4 is a plan view illustrating a photoelectric conversion device.

The first electrode 210 formed on the second silicon semiconductor layer 120 is a current collection electrode and is formed in a lattice pattern as shown in a plan view in FIG. 4. In order to form a depressed portion in which a side of a projected portion is shared by a side of the base of an inverted square pyramid shape as shown in FIG. 4, the side is positioned so as to be parallel or perpendicular to a <110> axis using a (100) plane of the single crystal silicon substrate 100 as an initial surface. The lattice pattern shown in FIG. 4 is an example, and the widths and the shapes of the projected portion and the depressed portion are not limited thereto. However, when the depressed portion is assumed to be an opening region in the plan view shown in FIG. 4, the aperture ratio (ratio of the area of the opening region to the total area of the opening region and the lattice) is preferably 50% or more. Further, the side of the depressed portion in the plan view is preferably greater than or equal to 1 μm and less than or equal to 100 μm, more preferably, greater than or equal to 10 μm and less than or equal to 50 μm.

On the one surface side of the single crystal silicon substrate 100 on which the first electrode 210 is formed, the third silicon semiconductor layer 130 and the fourth silicon semiconductor layer 140 are stacked in this order to, cover the surface of the stacked structure of the single crystal silicon substrate 100, the first silicon semiconductor layer 110, the second silicon semiconductor layer 120, and the first electrode 210.

As described above, the third silicon semiconductor layer 130 an i-type silicon semiconductor layer, which is provided so as to cover the one surface of the single crystal silicon substrate 100 and terminate the defects of the single crystal silicon substrate 100.

Further, the fourth silicon semiconductor layer 140 is a semiconductor layer having a conductivity type opposite to that of the single crystal silicon substrate 100. Thus, a p-n junction is formed between the single crystal silicon substrate 100 and the fourth silicon semiconductor layer 140 with the third silicon semiconductor layer 130 interposed therebetween. Note that the fourth silicon semiconductor layer 140 can be formed as an amorphous silicon layer or a microcrystalline silicon layer containing an impurity for imparting a conductivity type.

Note that the second silicon semiconductor layer 120 is preferably formed to have a higher carrier concentration than the fourth silicon semiconductor layer 140. In order to specify such a structure, in this specification, the conductivity type of a semiconductor layer having a relatively low carrier concentration such as the fourth silicon semiconductor layer 140 is referred to as n-type or p-type, whereas the conductivity type of a semiconductor layer having a relatively high carrier concentration such as the second silicon semiconductor layer 120 is referred to as $n^+$-type or $p^+$-type.

By the above structure, on the one surface of the single crystal silicon substrate 100, a p-n junction is formed almost over the entire surface. However, the i-type third silicon semiconductor layer 130 having high resistance is provided between the fourth silicon semiconductor layer 140 and the first electrode 210; thus, carriers flowing into the fourth silicon semiconductor layer 140 are not effectively collected directly through the third silicon semiconductor layer 130.

However, a region 240 having p-type or n-type conductivity is formed in part of the third silicon semiconductor layer 130, which contributes to carrier collection. The region 240 is sandwiched between the second silicon semiconductor layer 120 and the fourth silicon semiconductor layer 140 each of which contains an impurity imparting a conductivity type. The region 240 is formed by diffusion of the impurities imparting a conductivity type from the semiconductor layers in contact with the region 240 in a film thickness direction. The region 240 has the same conductivity type as the second silicon semiconductor layer 120 and the fourth silicon semiconductor layer 140; thus, the fourth silicon semiconductor layer 140 can be connected to the second silicon semiconductor layer 120 through the region 240, and carriers flowing into the fourth silicon semiconductor layer 140 can be effectively collected.

FIGS. 1A and 1B are different in the structure of the other surface side of the single crystal silicon substrate 100 on which the p-n junction is not formed. Thus, each structure is described below.

In the structure shown in FIG. 1A, the fifth silicon semiconductor layer 150, the sixth silicon semiconductor layer 160, and the second electrode 220 are stacked in this order on the other surface of the single crystal silicon substrate 100 on which the unevenness is not formed. The fifth silicon semiconductor layer 150 is an i-type silicon semiconductor layer as described above, which is provided so as to cover the other surface of the single crystal silicon substrate 100 and terminate the defects of the single crystal silicon substrate 100.

The sixth silicon semiconductor layer 160 has the same conductivity type as the single crystal silicon substrate 100 and is an impurity semiconductor layer having a higher carrier concentration than the single crystal silicon substrate 100. A $p$-$p^+$ junction or an $n$-$n^+$ junction is formed between the single crystal silicon substrate 100 and the sixth silicon semiconductor layer 160 with the fifth silicon semiconductor layer 150 provided therebetween. That is, the sixth silicon semiconductor layer 160 functions as a Back Surface Field (BSF) layer. By the provision of the BSF layer, minority carriers are repelled and attracted to the p-n junction side, whereby carrier recombination in the vicinity of the second electrode 220 can be prevented. Note that the sixth silicon semiconductor layer 160 can be formed as an amorphous silicon layer or a microcrystalline silicon layer containing an impurity imparting a conductivity type.

In the structure shown in FIG. 1B, unevenness is formed on the other surface of the single crystal silicon substrate 100 similarly to the unevenness formed on the one surface thereof. Thus, except for the sixth silicon semiconductor layer 160 and the eighth silicon semiconductor layer 180, a structure similar to the stacked structure formed on the one surface of the single crystal silicon substrate 100 may be formed on the other surface thereof. In this embodiment, the first silicon semiconductor layer 110 and the fifth silicon semiconductor layer 150, the third silicon semiconductor layer 130 and the seventh silicon semiconductor layer 170, the first electrode 210 and the second electrode 220, and the protective layer 230 and the protective layer 231 can each be formed of the same material and have the same thickness. Note that the sixth silicon semiconductor layer 160 and the eighth silicon semiconductor layer 180 have the same conductivity as the single crystal silicon substrate 100, and are silicon semiconductor layers having a higher carrier concentration than the single crystal silicon substrate 100. The material and the thickness of the first electrode 210 may be different from those of the second electrode 220. The fifth silicon semiconductor layer 150 and the seventh silicon semiconductor layer 170 are i-type silicon semiconductor layers as described above, and the seventh silicon semiconductor layer 170 is provided so as to cover the other surface the single crystal silicon substrate 100 and terminate the defects of the single crystal silicon substrate 100. Further, the sixth silicon semiconductor layer 160 and the eighth silicon semiconductor layer 180 each function as a BSF layer.

In summary, a photoelectric conversion device according to an embodiment of the present invention has: over at least one of surfaces of a single crystal silicon substrate 100 with one conductivity type, a latticed i-type silicon semiconductor layer (110, 150); a latticed silicon semiconductor layer (120, 160) with a conductivity type opposite to that of the single crystal silicon substrate 100; and a latticed electrode (210, 220) in that order, where a depressed portion is provided in an opening region of a lattice structured by the i-type silicon semiconductor layer (110, 150), the silicon semiconductor layer (120, 160), and the electrode (210, 220). Additionally, an i-type silicon semiconductor layer (130, 170), a silicon semiconductor layer (140, 160), which has a conductivity type opposite to that of the single crystal silicon substrate 100 and a reduced carrier concentration compared with the silicon semiconductor layer (120, 160), and a protective layer (230, 231) are provided so as to cover the depressed portion, the latticed i-type silicon semiconductor layer (110, 150), the latticed silicon semiconductor layer (120, 160), and the latticed electrode (210, 220).

Note that in the seventh silicon semiconductor layer 170, a region 241 in which impurities are diffused to the entire region in the film thickness direction from the semiconductor layers containing the impurities and being in contact with two sides of the region 241 and to which a conductivity type is provided, is formed similarly to the region 240. Thus, the eighth silicon semiconductor layer 180 can be connected to the sixth silicon semiconductor layer 160, and carriers flowing into the eighth silicon semiconductor layer 180 can be effectively collected.

In the photoelectric conversion device according to one embodiment of the present invention, electric characteristics of the photoelectric conversion device can be improved by the aforementioned optical effect due to the unevenness and the provision of $p$-$n^+$ junction or $p^+$-$n$ junction on the top of the projected portion.

In a photoelectric conversion device having a p-n junction, the increase of the electric field in the p-n junction and the increase of a diffusion potential are one method to improve electric characteristics. In general, the diffusion potential can be increased by forming a junction with the use of a $p^+$-type semiconductor or an $n^+$-type semiconductor having a high carrier concentration; however, the highly doped impurities imparting conductivity types in the $p^+$-type semiconductor and the $n^+$-type semiconductor increase the number of localized levels. Further, the interface states are formed because of the increased number of localized levels, whereby carrier recombination in the vicinity of a junction portion is induced. Thus, electric characteristics of the photoelectric conversion device are degraded.

On the other hand, in the photoelectric conversion device according to one embodiment of the present invention, on the one surface of the single crystal silicon substrate 100, a $p^+$-type semiconductor Or an $n^+$-type semiconductor which has a high carrier concentration is provided only over the top of the projected portion to form a p-n junction, and a p-type semiconductor and an n-type semiconductor each of which have a relatively low carrier concentration are provided for the other regions to form a p-n junction. With this structure, the area occupied by a p-n junction region of the $p^+$-type semiconductor and $n^+$-type semiconductor with a high carrier concentration can be reduced, and carrier recombination affected by the interface state can be suppressed as much as possible while the diffusion potential is increased. Accordingly, an open circuit voltage (Voc) and a till factor (F.F.) can be particularly improved.

Further, in the photoelectric conversion device according to one embodiment of the present invention, the first-electrodes 210 are provided at an interval of for example several tens of micrometers; thus, carrier flowing into the fourth silicon semiconductor layer 140 from the p-n junction portion in a depressed portion can be efficiently collected in the first electrode 210 through the second silicon semiconductor layer 120.

Thus, a structure in which a light-transmitting conductive film such as indium tin oxide (ITO) is not necessary can be obtained. With this structure, a material having high transmittance, which is effective for photoelectric conversion, can be used for the protective layers 230 and 231 and thus light absorption loss can be reduced. An example of the material includes an insulating layer such as a silicon oxide layer or a silicon nitride layer. The insulating layer is excellent in passivation properties on a surface of a semiconductor layer and antireflection properties to light compared to a light-transmitting conductive film; thus, short-circuit current can be particularly improved. Accordingly, the photoelectric, conversion device according to one embodiment of the present invention can improve an open circuit voltage, a fill factor, and a short-circuit current, so that photoelectric conversion efficiency can be increased.

Figure 2A:
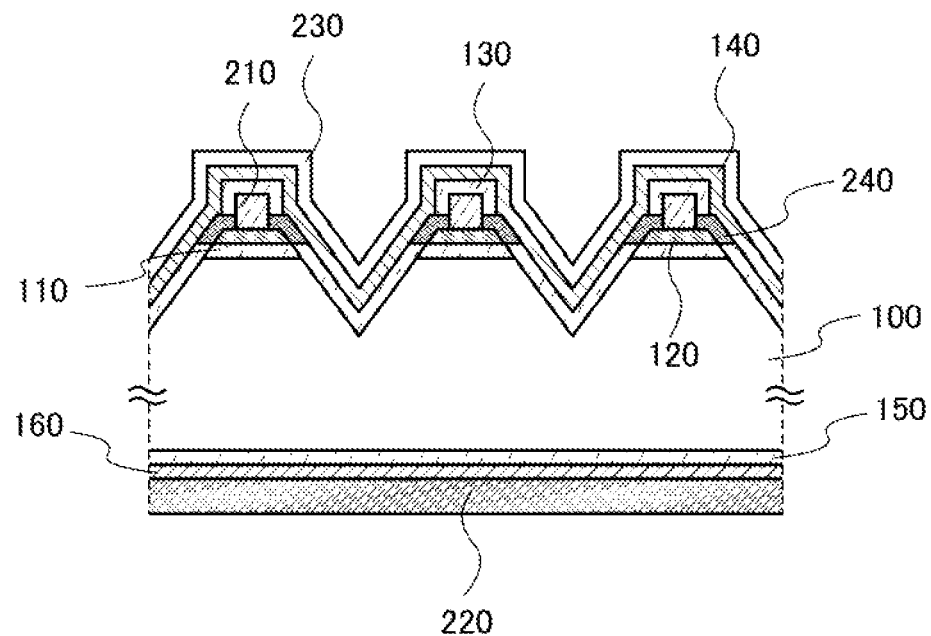
FIGS. 2A and 2B are cross-sectional views each illustrating a photoelectric conversion device.
Figure 2B:
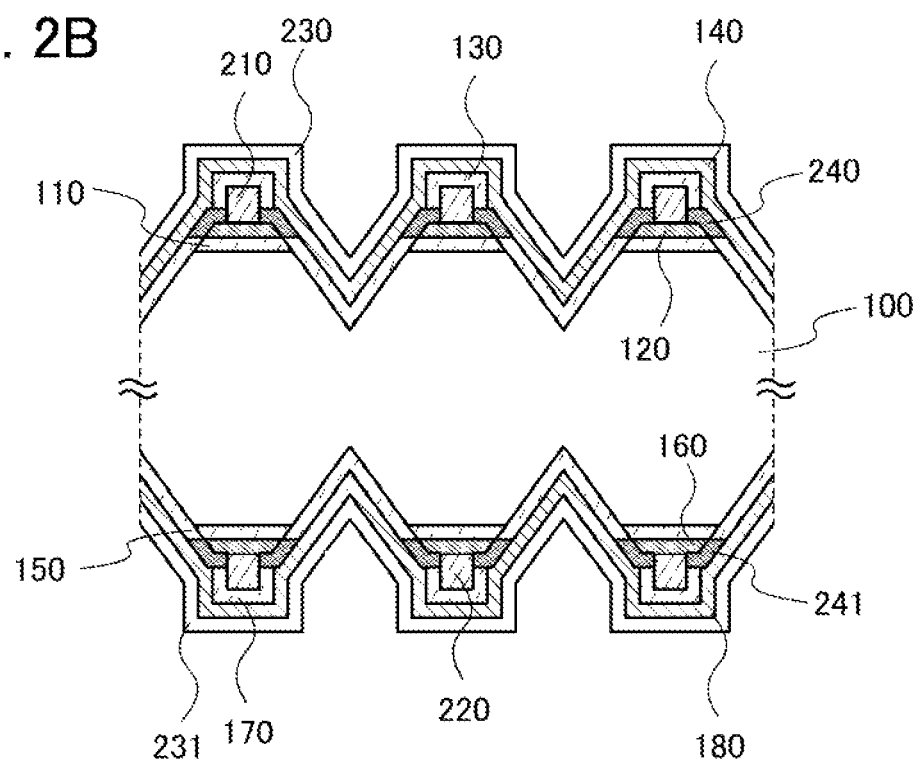

A photoelectric conversion device according to one embodiment of the present invention can also have either of the structures shown in FIGS. 2A and 2B. The structures shown in FIGS. 2A and 2B differ from those in FIGS. 1A and 1B in that, in the structures of FIGS. 2A and 2B, the width of an interface between the second silicon semiconductor layer 120 and the first electrode 210 is smaller than the width of the second silicon semiconductor layer 120. Further, the structure shown in FIG. 2B differs from that in FIG. 1B in that, in the structure of FIG. 2B, the width of an interface between the sixth silicon semiconductor layer 160 and the second electrode 220 is smaller than the width of the sixth silicon semiconductor layer 160.

In each of the structures shown in FIGS. 2A and 2B, the width of the first electrode 210 is smaller than that of the second silicon semiconductor layer 120 at the top of the projected portion. Thus, the region 240 that is part of the third silicon semiconductor layer 130 sandwiched between the second silicon semiconductor layer 120 and the fourth silicon semiconductor layer 140 increases in size compared with, the structures shown in FIGS. 1A and 1B, so that contact properties between the second silicon semiconductor layer 120 and the fourth silicon semiconductor layer 140 through the region 240 can be improved. Further, the region 241 in FIG. 213 also increases in size compared with the structure shown in FIG. 1B, and contact properties between the sixth silicon semiconductor layer 160 and the eighth silicon semiconductor layer 180 through the region 241 can be improved.

Figure 3A:
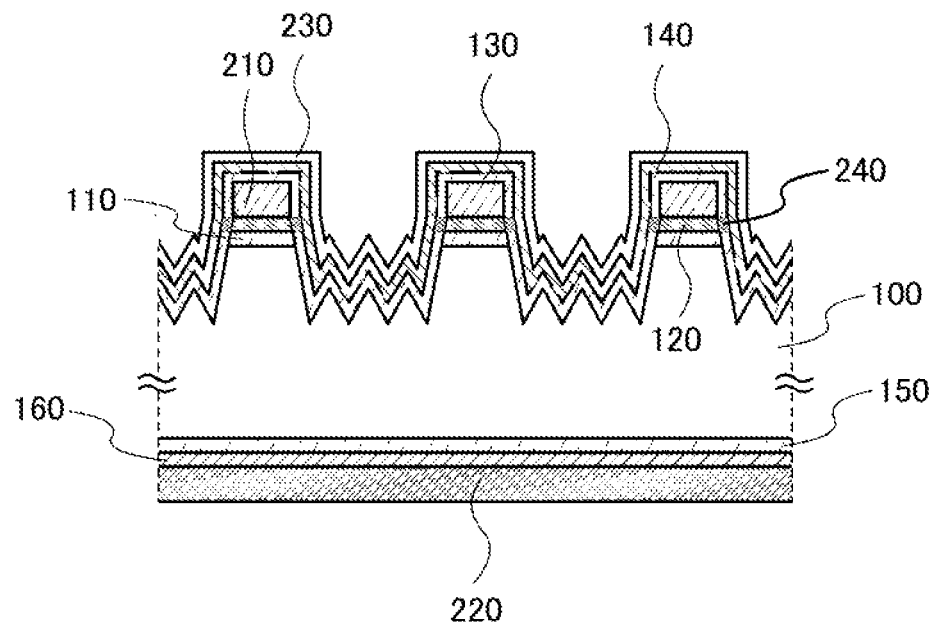
FIGS. 3A and 3B are cross-sectional views each illustrating a photoelectric conversion device.
Figure 3B:
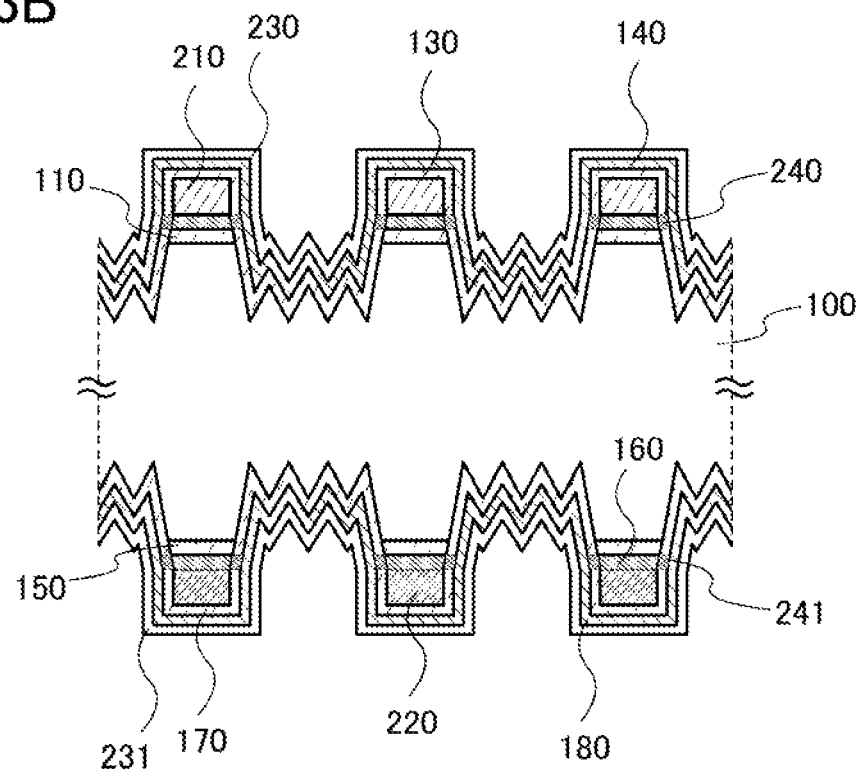

A photoelectric conversion device according to one embodiment of the present invention can have either of the structures shown in FIGS. 3A and 3B. The structures shown in FIGS. 3A and 3B differ from those in FIGS. 1A and 1B in that, in the structures in FIGS. 3A and 3B, a plurality of unevenness is formed in the depressed portion. In other words, the structures in FIGS. 3A and 3B possess a surface with a saw-toothed shape in the depressed portion. Note that the shape and the number of the projections and depressions formed in the depressed portion are not limited to those shown in the figure.

In the structures shown in FIGS. 3A and 3B, a plurality of minute projections and depressions are formed in the depressed portion. That is, the depressed portion possesses a saw-toothed surface. Thus, reflection of light that enters the single crystal silicon substrate 100 at both surfaces of a substrate is promoted, and the optical path length can be increased.

Note that, in one embodiment of the present invention, a photoelectric conversion device may have a shape in which structures of the photoelectric conversion devices shown in FIGS. 1B, 2B, and 3B are combined. For example, the photoelectric conversion device may have the structure of FIGS. 1A and 1B on its p-n junction side and the structure of FIG. 2B on its BSF side.

Next, a method for manufacturing the photoelectric conversion device having the structure shown in FIG. 1A will be described. Methods for manufacturing the photoelectric conversion devices having the structures shown in FIGS. 2A and 3A will be described as appropriate. Note that the photoelectric conversion devices having the structures shown in FIGS. 1B, 2B, and 3B can be manufactured with reference to the manufacturing methods of the photoelectric conversion devices shown in FIGS. 1A, 2A, and 3A; thus, the description thereof is omitted.

The conductivity type and the manufacturing method of the single crystal silicon substrate 100 that can be used in one embodiment of the present invention are not limited and can be determined by the practitioner as appropriate. In this embodiment, an example of using an n-type single crystal silicon substrate is described.

First, the first silicon semiconductor layer 110 is formed on the one surface of the single crystal silicon substrate 100 by a plasma CVD method. The thickness of the first silicon semiconductor layer 110 is preferably greater than or equal to 3 nm and less than or equal to 50 nm. Here, the first silicon semiconductor layer 110 is formed using i-type amorphous silicon, and the thickness thereof is 5 nm.

For example, the first silicon semiconductor layer 110 can be formed under the following conditions: monosilane is introduced to a reaction chamber; the pressure inside the reaction chamber is higher than or equal to 100 Pa and lower than or equal to 200 Pa; the electrode interval is greater than or equal to 10 mm and less than or equal to 40 mm; the power density based on the area of a cathode electrode is greater than or equal to 8 mW/cm$^2$ and less than or equal to 50 mW/cm$^2$; and the substrate temperature is greater than or equal to 150° C. and less than or equal to 300° C.

Next, the second silicon semiconductor layer 120 is formed on the first silicon semiconductor layer 110. The thickness of the second silicon semiconductor layer 120 is preferably greater than or equal to 3 nm and less than or equal to 50 nm. Here, the second silicon semiconductor layer 120 is formed using p-type amorphous silicon, and the thickness thereof is 10 nm.

The second silicon semiconductor layer 120 can be formed under the following conditions: monosilane and hydrogen-based diborane (0.1%) are introduced to a reaction chamber with a flow ratio of 1:2 to 50; The pressure inside the reaction chamber is higher than or equal to 100 Pa and lower than or equal to 200 Pa; the electrode interval is greater than or equal to 10 mm and less than or equal to 40 mm; the power density based on the area of a cathode electrode is greater than or equal to 8 mW/cm$^2$ and less than or equal to 50 mW/cm$^2$; and the substrate temperature is greater than or equal to 150° C. and less than or equal to 300° C.

Figure 5A:
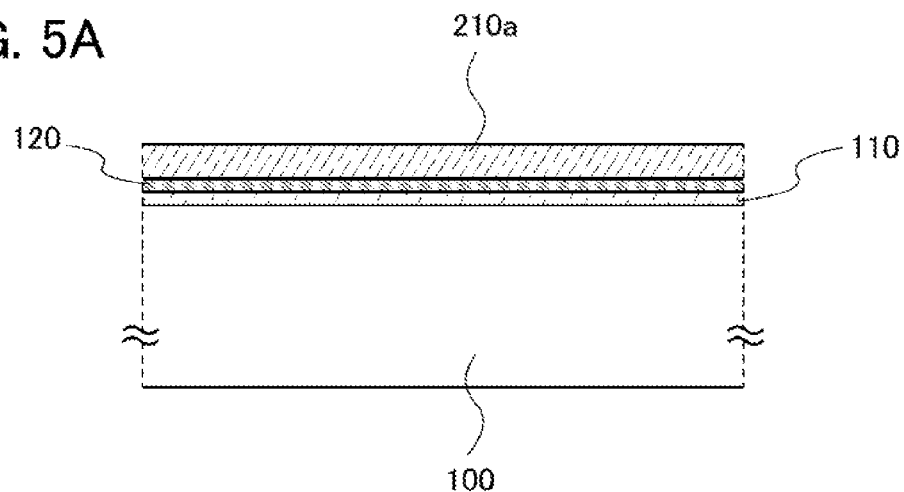
FIGS. 5A to 5C are cross-sectional views illustrating a method for manufacturing a photoelectric conversion device.

Next, a conductive layer 210a for forming the first electrode 210 is formed on the second silicon semiconductor layer 120 (see FIG. 5A). The conductive layer 210a can be formed using a low resistance metal such as silver, aluminum, or copper by a sputtering method, a vacuum evaporation method, or the like.

Next, the fifth silicon semiconductor layer 150 is formed on the other surface of the single crystal silicon substrate 100 by a plasma CVD-method. The fifth silicon semiconductor layer 150 preferably has a thickness of greater than or equal to 3 nm and less than or equal to 50 nm. Here, the fifth silicon semiconductor layer 150 is formed using i-type amorphous silicon, and the thickness thereof is 5 nm. Note that the fifth silicon semiconductor layer 150 can be formed under the filth formation conditions similar to those of the first silicon semiconductor layer 110.

Next, the sixth silicon semiconductor layer 160 is formed, on the fifth silicon semiconductor layer 150. The thickness of the sixth silicon semiconductor layer 160 is preferably greater than or equal to 3 nm and less than or equal to 50 nm. Here, the sixth silicon semiconductor layer 160 is formed using n-type amorphous silicon, and the thickness thereof is 10 nm.

The sixth silicon semiconductor layer 160 can be formed under the following conditions: monosilane and hydrogen-based phosphine (0.5%) are introduced to a reaction chamber with a flow ratio of 1:1 to 50; the pressure inside the reaction chamber is higher than or equal to 100 Pa and lower than or equal to 200 Pa; the electrode interval is greater than or equal to 8 mm and less than or equal to 40 mm; the power density based on the area of a cathode electrode is greater than or equal to 8 mW/cm$^2$ and less than or equal to 50 mW/cm$^2$; and the substrate temperature is greater than or equal to 150° C. and less than or equal to 300° C.

Note that in this embodiment, although an RF power source with a frequency of 60 MHz is used as a power source of the plasma CVD in forming the silicon semiconductor layers, an RF power source with a frequency of 13.56 MHz, 27.12 MHz, 60 MHz, or 100 MHz may be used. Furthermore, film formation may be performed by pulsed discharge as well as by continuous discharge. The implementation of pulsed discharge can improve the film quality and reduce particles produced in the gas phase.

Figure 5B:
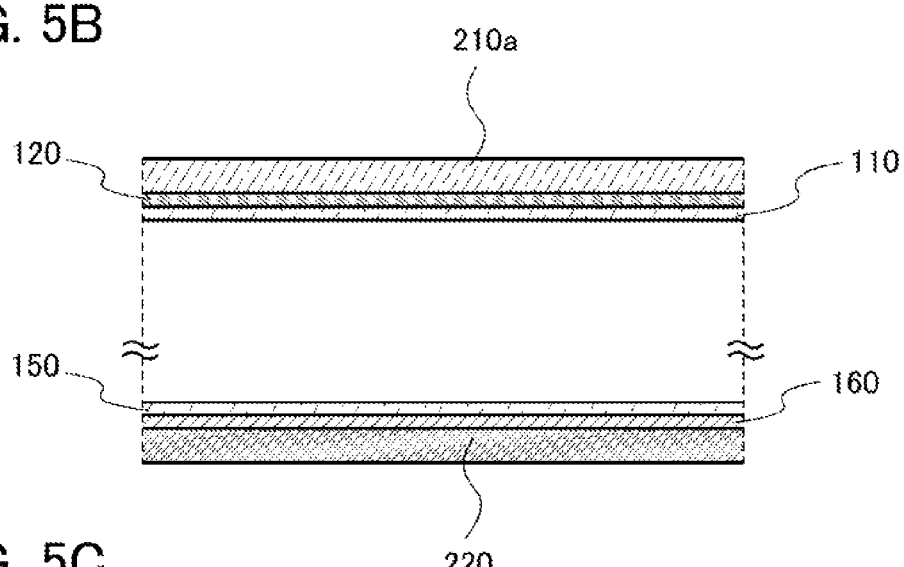

Subsequently, the second electrode 220 is formed on the sixth silicon semiconductor layer 160 (see FIG. 5B). The second electrode 220 can be formed using a low-resistance metal such as silver, aluminum, or copper by a sputtering method, a vacuum evaporation method, or the like. Alternatively, the second electrode 220, may be formed using a resin including a conductive material such as a silver paste or a copper paste by a screen printing method.

Next, a resist mask 300 having a shape corresponding to the shape of the top surface of the first electrode 210 as shown in the plan view in FIG. 4 is formed over the conductive layer 210a. In addition, a resist mask 301 is formed over the entire surface of the second electrode 220. The resist mask can be formed by a known method such as a photolithography method, a screen printing method, or a dispensing method.

Next, a region of the conductive layer 210a, which is not covered with the resist mask 300, is etched by a known method such as wet etching, so that the first electrode 210 is formed.

Figure 5C:
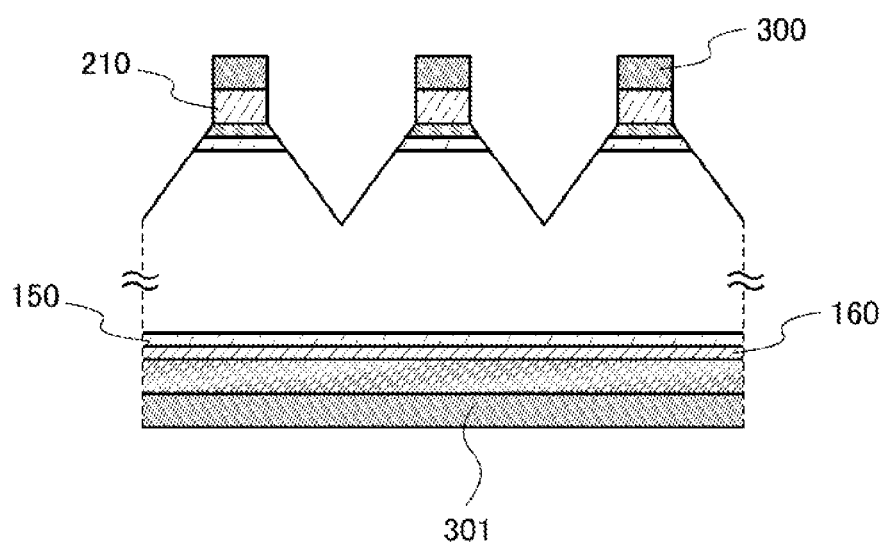

Next, the second silicon semiconductor layer 120, the first silicon semiconductor layer 110, and the single crystal silicon substrate 100 are partly etched to give the depressed portion to a region surrounded by the lattice-shaped first electrode 210 (see FIG. 5C).

The depressed portion is formed to have the shape of an inverted square pyramid utilizing a difference in etching rates between plane orientations in alkaline etching of crystalline silicon. For an etchant, an alkaline solution with a relatively low concentration, for example, 1% to 6% aqueous sodium hydroxide solution, or 1% to 6% aqueous potassium hydroxide solution can be used. The temperature of the etchant is 70° C. to 90° C., and the single crystal silicon substrate is soaked in the etchant for 30 to 60 minutes. With this treatment, a projected portion where the first electrode is formed at the top portion and a depressed portion formed between adjacent projections and having the shape of an inverted square pyramid can be formed on the surface of the single crystal silicon substrate 100. Note that in this step, the resist masks 300 and 301 may be incidentally removed, because the first electrode 210 and the second electrode 200 each serve as a mask.

Next, an oxide layer on the surface of silicon, which is formed in the etching, is removed, and a component of the alkaline solution, which remains in the oxide layer, is removed. When an alkali metal ion, e.g., a Na ion or a K ion enters silicon, the lifetime is decreased, and electric characteristics of the photoelectric conversion device are drastically lowered. Note that 1% to 5% diluted hydrofluoric acid can be used to remove the oxide layer.

Preferably, the surface of the single crystal silicon substrate 100 is sequentially etched using a mixed acid in which hydrofluoric acid and nitric acid are mixed, or using the mixed acid to which acetic acid is added so that an impurity such as a metal component is removed. Addition of acetic acid allows the oxidizing ability of nitric acid to be maintained, the etching-process to be stably performed, and the etching rate to be readily controlled. For example, a volume ratio of hydrofluoric acid (approximately 50%), nitride acid (60% or more) and acetic acid (90% or more) can be 1:1.5 to 3:2 to 4. When the etching with the use of the mixed solution (hydrofluoric-nitric-acetic acid) is performed, the step of removing the oxide layer using the diluted hydrofluoric acid can be omitted.

Figure 7A:
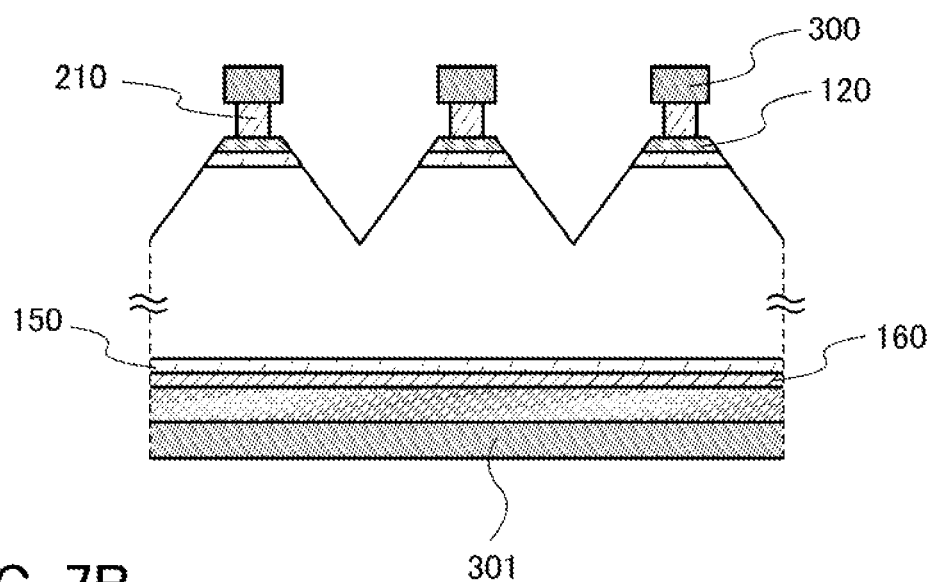
FIGS. 7A and 7B are cross-sectional views illustrating a method for manufacturing a photoelectric conversion device.
Figure 7B:
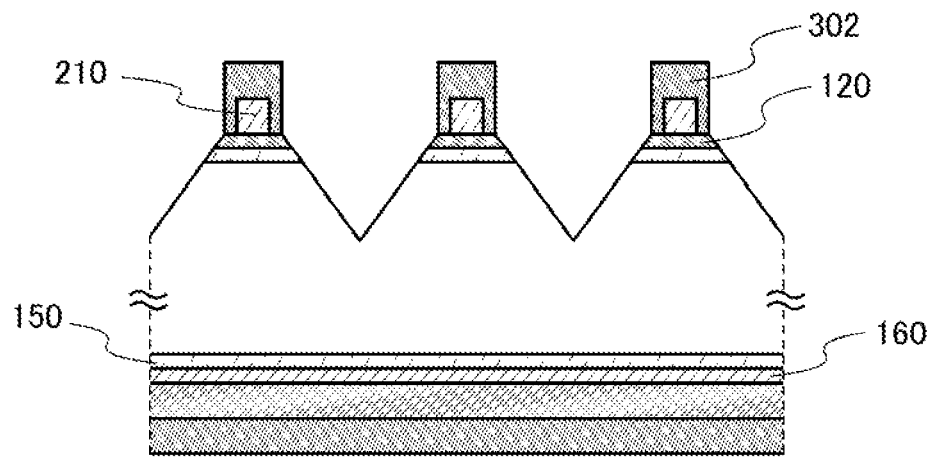

In order to manufacture the photoelectric conversion device having the structure shown in FIG. 2A, the first electrode 210 is etched in a lateral direction after the formation of the depressed portion, so that the width of the first electrode 210 can be decreased (see FIG. 7A). However, in the case where the resist mask 300 has poor alkali resistance, a resist mask 302 covering the first electrode 210 may be formed after the formation of the first electrode 210 and then the formation of the depressed portion may be performed (see FIG. 7B).

In order to manufacture a photoelectric conversion device having the structure shown in FIG. 3A, etching conditions for forming the depressed portion is adjusted. For example, the etching time is shortened, whereby a plurality of projections and depressions (i.e., the saw-toothed shape) can be formed in the depressed portion. When isopropyl alcohol is added to the etchant, the size of the projection and depression can be made small; thus, the photoelectric conversion device having the structure shown in FIG. 3A can be easily formed.

Figure 6A:
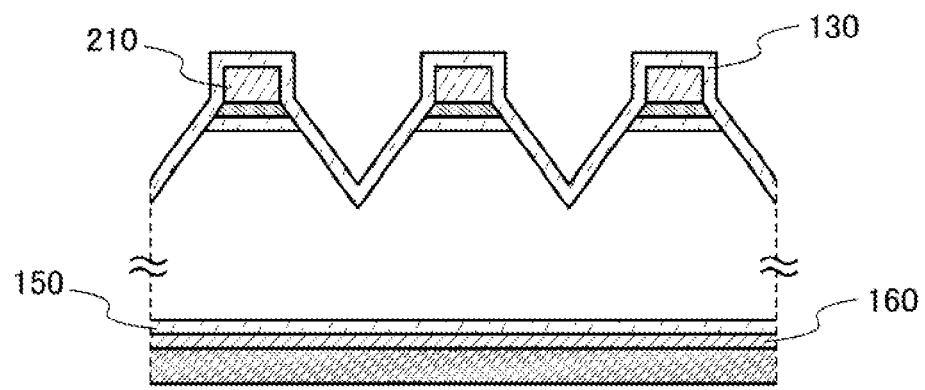
FIGS. 6A to 6C are cross-sectional views illustrating a method for manufacturing a photoelectric conversion device.
Figure 6B:
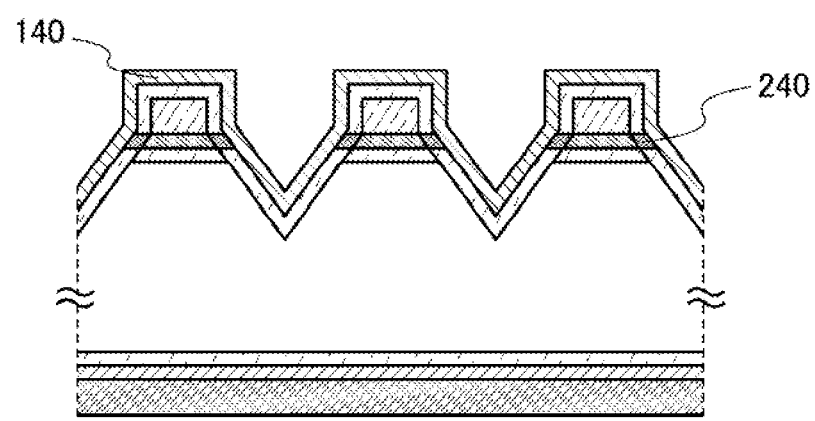
Figure 6C:
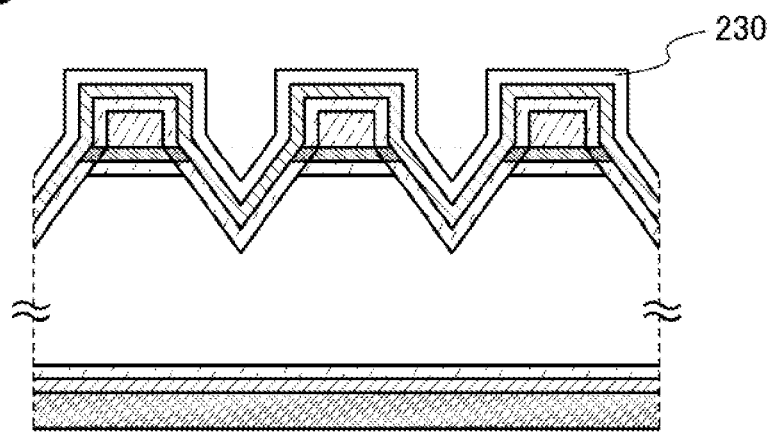

Next, after the resist masks 300 and 301 are removed and proper cleaning is performed, the third silicon semiconductor layer 130 is formed so as to cover the exposed surface of the single crystal silicon substrate 100 and the surface of the stacked structure of the first silicon semiconductor layer 110, the second silicon semiconductor layer 120, and the first electrode 210 (see FIG. 6A). The third silicon semiconductor layer 130 can be formed by a method similar to that of the first silicon semiconductor layer 110.

Then, the fourth silicon semiconductor layer 140 is formed on the third silicon semiconductor layer 130. The fourth silicon semiconductor layer 140 can be formed by a method similar to that of the second silicon semiconductor layer 120. However, in order to suppress carrier recombination in the vicinity of the p-n junction as much as possible as described above, it is preferable that the carrier concentration in the second silicon semiconductor layer 120 be relatively high and the carrier concentration in the fourth silicon semiconductor layer 140 be relatively low.

The flow rate of a dopant gas (here, diborane) may be changed in film formation by a plasma CVD method so that a film with a controlled carrier concentration can be formed. In the range of the flow rate of diborane in the aforementioned film formation conditions, as the flow rate of diborane is high, the carrier concentration can be high. Alternatively, the film formation pressure, the temperature, and the power density and the like may be changed so that amorphous silicon and microcrystalline silicon are separately formed and the carrier concentration is adjusted. In that case, if impurity contents in the microcrystalline silicon and the amorphous silicon are the same, the carrier concentration is easily increased in the microcrystalline silicon because an activation rate of impurities is high.

Here, in the region which is part of the third silicon semiconductor layer 130 sandwiched between the second silicon semiconductor layer 120 and the fourth silicon semiconductor layer 140 and which includes an impurity imparting a conductivity type, the region 240 whose conductivity is changed from i-type by the diffusion of the impurities from the second silicon semiconductor layer 120 and the fourth silicon semiconductor layer 140 is formed. Note that the impurity included in each of the second silicon semiconductor layer 120 and the fourth silicon semiconductor layer 140 is boron; thus, the conductivity of the region 240 becomes p-type.

Next, the protective layer 230 is formed over the fourth silicon semiconductor layer 140. A light-transmitting insulating film such as a silicon oxide film or a silicon nitride film formed by a plasma CVD method or the like is preferably used for the protective film. The protective layer not only provides physical protection but is capable of terminating surface defects of the fourth silicon semiconductor layer 140, preventing the light reflection at the surface, and efficiently introducing light in the single crystal silicon substrate 100.

In any region of the photoelectric conversion device, part of the third silicon semiconductor layer 130, part of the fourth silicon semiconductor layer 140, and part of the protective layer 230 which are formed over the first electrode 210 are removed by a know method as necessary so that part of the first electrode 210 is exposed. In addition, an extraction electrode in contact with the region where the first electrode 210 is exposed may be provided. The region where the first electrode 210 is exposed or the extraction electrode can be used to connect with a load, or to electrically connect a plurality of photoelectric conversion devices having the same structures in series or in parallel.

Through the above steps, the photoelectric conversion device according to one embodiment of the present invention can be manufactured.

This application is based on Japanese Patent Application serial no. 2011-116489 filed with Japan Patent Office on May 25, 2011, the entire contents of which are hereby incorporated by reference.

What is claimed is:

1. A photoelectric conversion device comprising:
a single crystal silicon substrate; and
a lattice-shaped current collection electrode over a surface of the single crystal silicon substrate,
wherein the single crystal silicon substrate-includes a depressed portion overlapped with an opening region of a lattice of the current collection electrode.

2. The photoelectric conversion device according to claim 1, wherein the current collection electrode comprises a metal.

3. The photoelectric conversion device according to claim 1, wherein the depressed portion has an inverted square pyramid shape.

4. The photoelectric conversion device according to claim 1, further comprising a lattice-shaped second current collection electrode over the other surface of the single crystal silicon substrate, wherein a second depressed portion is provided to the single crystal silicon substrate in an opening region of a lattice structured by the second current collection electrode.

5. A photoelectric conversion device comprising:
a single crystal silicon substrate;
a first silicon semiconductor layer over one surface of the single crystal silicon substrate, the first silicon semiconductor layer having an i-type conductivity;
a second silicon semiconductor layer over the first silicon semiconductor layer, wherein the single crystal silicon substrate, the first silicon semiconductor layer, and the second silicon semiconductor layer are arranged to form a p-n heterojunction;
a first electrode over the second silicon semiconductor layer, wherein the first silicon semiconductor layer, the second silicon semiconductor layer, and the first electrode have a lattice shape;
a depressed portion provided to the single crystal silicon substrate, wherein the depressed portion is overlapped with an opening region of the lattice shape;
a third silicon semiconductor layer over the depressed portion and the first electrode, the third silicon semiconductor layer having an i-type conductivity; and
a fourth silicon semiconductor layer over the third silicon Semiconductor layer, wherein the single crystal silicon substrate, the third silicon semiconductor layer, and the fourth silicon semiconductor layer are arranged to form heterojunction.

6. The photoelectric conversion device according to claim 5, further comprising a protective film over the fourth silicon semiconductor layer.

7. The photoelectric conversion device according to claim 5, wherein the first electrode comprises a metal.

8. The photoelectric conversion device according to claim 5, wherein the first electrode is in contact with the second silicon semiconductor layer.

9. The photoelectric conversion device according to claim 5, wherein the depressed portion has an inverted square pyramid shape.

10. The photoelectric conversion device according to claim 5, wherein a carrier concentration of the second silicon semiconductor layer is higher than a carrier concentration of the fourth silicon semiconductor layer.

11. The photoelectric conversion device according to claim 5,
wherein a region of the third silicon semiconductor layer, which is located between and in contact with the second silicon semiconductor layer and the fourth silicon semiconductor layer, has the same conductivity type as the second silicon semiconductor layer and the fourth silicon semiconductor layer, and
wherein the other region of the third silicon semiconductor layer has the i-type conductivity.

12. The photoelectric conversion device according to claim 5, further comprising:
a fifth silicon semiconductor layer over the other surface of the single crystal silicon substrate, the fifth silicon semiconductor layer having an i-type conductivity;
a sixth silicon semiconductor layer over the fifth silicon semiconductor layer, wherein the single crystal silicon substrate and the sixth silicon semiconductor layer have the same conductivity type; and
a second electrode over the sixth silicon semiconductor layer.

13. A photoelectric conversion device comprising:
a single crystal silicon substrate;
a first silicon semiconductor layer over one surface of the single crystal silicon substrate, the first silicon semiconductor layer having an i-type conductivity;
a second silicon semiconductor layer over the first silicon semiconductor layer, wherein the single crystal silicon substrate, the first silicon semiconductor layer, and the second silicon semiconductor layer are arranged to form a p-n heterojunction;
a first electrode over the second silicon semiconductor layer, wherein the first silicon semiconductor layer, the second silicon semiconductor layer, and the first electrode have a first lattice shape;
a first depressed portion provided to the single crystal silicon substrate, wherein the first depressed portion is overlapped with an opening region of the first lattice shape;
a third silicon semiconductor layer over the first depressed portion and the first electrode, the third silicon semiconductor layer having an i-type conductivity;
a fourth silicon semiconductor layer over the third silicon semiconductor layer, wherein the single crystal silicon substrate, the third silicon semiconductor layer, and the fourth silicon semiconductor layer are arranged to form a p-n heterojunction;
a fifth silicon semiconductor layer over the other surface of the single crystal silicon substrate, the fifth silicon semiconductor layer having an i-type conductivity;
a sixth silicon semiconductor layer over the fifth silicon semiconductor layer, wherein the single crystal silicon substrate and the sixth silicon semiconductor layer have the same conductivity;
a second electrode over the sixth silicon semiconductor layer, wherein the fifth silicon semiconductor layer, the sixth silicon semiconductor layer, and the second electrode have a second lattice shape;
a second depressed portion provided to the single crystal silicon substrate, wherein the second depressed portion is overlapped with an opening region of the second lattice shape;
a seventh silicon semiconductor layer over the second depressed portion and the second electrode, the seventh silicon semiconductor layer having an i-type conductivity; and
an eighth silicon semiconductor layer over the seventh silicon semiconductor layer, wherein the single crystal silicon substrate and the eighth silicon semiconductor layer have the same conductivity.

14. The photoelectric conversion device according to claim 13, further comprising a protective film over at least one of the fourth silicon semiconductor layer and the eighth silicon semiconductor layer.

15. The photoelectric conversion device according to claim 13, wherein at least one of the first electrode and the second electrode comprises a metal.

16. The photoelectric conversion device according to claim 13, wherein the first electrode is in contact with the second silicon semiconductor layer.

17. The photoelectric conversion device according to claim 13, wherein the second electrode is in contact with the sixth silicon semiconductor layer.

18. The photoelectric conversion device according to claim 13, wherein at least one of the first depressed portion and the second depressed portion has an inverted square pyramid shape.

19. The photoelectric conversion device according to claim 13, wherein a carrier concentration of the second silicon semiconductor layer is higher than a carrier concentration of the fourth silicon semiconductor layer.

20. The photoelectric conversion device according to claim 13,
wherein a region of the third silicon semiconductor layer, which is located between and in contact with the second silicon semiconductor layer and the fourth silicon semiconductor layer, has the same conductivity type as the second silicon semiconductor layer and the fourth silicon semiconductor layer, and
wherein the other region of the third silicon semiconductor layer has the i-type conductivity.

* * * * *

UNITED STATES PATENT AND TRADEMARK OFFICE
CERTIFICATE OF CORRECTION

| | | |
|---|---|---|
| PATENT NO. | : 9,012,769 B2 | Page 1 of 2 |
| APPLICATION NO. | : 13/468367 | |
| DATED | : April 21, 2015 | |
| INVENTOR(S) | : Shunpei Yamazaki | |

It is certified that error appears in the above-identified patent and that said Letters Patent is hereby corrected as shown below:

In the Specification:

Col. 1, line 37, "R10-135497" should read --H10-135497--

Col. 2, line 4, "reducing, carrier" should read --reducing carrier--

Col. 2, line 51, "having, one" should read --having one--

Col. 2, line 65, "layer; the" should read --layer the--

Col. 3, line 30, "layer; have" should read --layer have--

Col. 3, line 66, "Film" should read --film--

Col. 4, line 2, "influence," should read --influence--

Col. 4, line 4, "Which" should read --which--

Col. 4, line 48, "a, third" should read --a third--

Col. 6, line 22, "reduced: specifically" should read --reduced; specifically--

Col. 6, line 44, "both or them" should read --both of them--

Col. 7, line 1, "Were" should read --before--

Col. 7, line 22, "between, the" should read --between the--

Col. 7, line 37, "Shawn" should read --shown--

Col. 8, line 13, "130 an i-type" should read --130 is an i-type--

Col. 10, line 38, "Or" should read --or--

Signed and Sealed this
Twenty-seventh Day of October, 2015

Michelle K. Lee
*Director of the United States Patent and Trademark Office*

CERTIFICATE OF CORRECTION (continued)
U.S. Pat. No. 9,012,769 B2

Col. 10, line 49, "till factor" should read --fill factor--

Col. 10, lines 52 and 53, "first-electrodes" should read --first electrodes--

Col. 11, lines 3 and 4, "photoelectric," should read --photoelectric--

Col. 11, line 27, "with, the" should read --with the--

Col. 11, lines 31 and 32, "FIG. 213" should read --FIG 2B--

Col. 12, line 38, "The" should read --the--

Col. 12, line 54, "CVD-method" should read --CVD method--

Col. 12, line 59, "the filth" should read --the film--

Col. 12, line 62, "formed," should read --formed--

Col. 13, line 27, "220, may" should read --220 may--

Col. 14, line 19, "alter" should read --after--

Col. 14, line 35, "alter" should read --after--

In the Claims:

Claim 5, Col. 16, line 15, "Semiconductor" should read --semiconductor--

Claim 5, Col. 16, line 18, "heterojunction." should read --a p-n heterojunction.--